United States Patent [19]

Aizenshtein et al.

[11] 4,396,478

[45] Aug. 2, 1983

[54] METHOD OF CONTROL OF CHEMICO-THERMAL TREATMENT OF WORKPIECES IN GLOW DISCHARGE AND A DEVICE FOR CARRYING OUT THE METHOD

[76] Inventors: Anatoly G. Aizenshtein, ulitsa Bosova, 18, kv. 12; Evgeny L. Agres, ulitsa Uritskogo, 40, kv. 27; Vladimir V. Kirichenko, ulitsa 9 Gvardeiskoi divizii, 43, kv. 93; Igor A. Kozlovsky, ulitsa Sovetskaya, 28, kv. 56; Nina E. Sizova, ulitsa Bosova, 14, kv. 92; Viktor V. Solomadin, ulitsa 9 Gvardeiskoi divizii, 43, kv. 20, all of Istra Moskovskaya oblast; Viktor N. Blinov, ulitsa Komarova, 2, kv. 30, Dedovsk, Moskovskaya oblast, all of U.S.S.R.

[21] Appl. No.: 273,390

[22] Filed: Jun. 15, 1981

[51] Int. Cl.$^3$ .............................................. C23C 15/00
[52] U.S. Cl. ............................ 204/192 R; 204/192 E; 204/298
[58] Field of Search ................ 204/192 E, 298, 192 R

[56] References Cited

U.S. PATENT DOCUMENTS

| 4,074,140 | 2/1978 | Edenhofer | 204/192 R |
|---|---|---|---|
| 4,166,783 | 9/1979 | Turner | 204/192 R |
| 4,172,020 | 10/1979 | Tisone et al. | 204/192 R |
| 4,201,645 | 5/1980 | Riegert | 204/298 |
| 4,274,936 | 6/1981 | Love | 204/192 R |
| 4,283,260 | 8/1981 | Thomas et al. | 204/192 R |

OTHER PUBLICATIONS

Gartner et al., IBM Technical Disclosure Bulletin, vol. 20, #3, Aug. 1977.

*Primary Examiner*—Arthur P. Demers
*Attorney, Agent, or Firm*—Lilling & Greenspan

[57] ABSTRACT

A method of control of chemico-thermal treatment of workpieces in a glow discharge comprising the steps of measuring the workpiece temperature, its rate of change and frequency of arc occurrence, comparing the measured quantities with their predetermined values, producing the corresponding error signals, and obtaining a control signal from the latter to control the glow discharge voltage.

A device for carrying out the method of the invention comprising a temperature sensor, a rate-of-change-of-temperature sensor, and an arc occurrence frequency sensor having their outputs connected to comparison elements adapted to compare said measured quantities with their predetermined values, and having their inputs connected to the workpieces and to leads of a discharge chamber. The comparison elements have their outputs coupled to the inputs of regulators of the temperature, its rate of change and frequency of arc occurrence, said regulators being coupled to a supply voltage source via a control unit. The corresponding inputs of the control unit are connected via a glow discharge voltage transmitter to the respective leads of the discharge chamber, the output of the transmitter being coupled to the corresponding inputs of the arc occurrence frequency sensor and control unit.

10 Claims, 7 Drawing Figures

METHOD OF CONTROL OF CHEMICO-THERMAL TREATMENT OF WORKPIECES IN GLOW DISCHARGE AND A DEVICE FOR CARRYING OUT THE METHOD

FIELD OF THE INVENTION

The invention relates to heat treatment, and more particularly to methods and devices for control of chemico-thermal treatment of articles in glow discharge.

The method and device of the invention include applications concerned, for example, with control of treatment of workpieces in ion nitration installations used in the machine building and aviation industries in order to attain higher workpiece strength.

DESCRIPTION OF THE PRIOR ART

The chemico-thermal treatment of workpieces in glow discharge, and ion nitration in particular, usually comprises two operational steps as follows: cleaning the workpiece surface using the cathode sputtering method and subjecting the workpieces to diffuse saturation or maintaining them at a given temperature. To provide for quick removal of different contaminants from the workpiece surface and also for a hardening layer evenly distributed over the surface, an important feature in treating complex alloyed steels, it is good practice to use a considerably higher voltage than the working one rated for the cathode sputtering method. This method gives, however, poor results at higher voltages due to the fact that glow discharge is often transformed into arc discharge in this case. During the initial period of treatment, the higher the voltage, the greater will be the frequency of such transformations. Under these circumstances, the workpiece surface being treated may be damaged when the frequency of arc occurrence exceeds a permissible value. Thus the voltage at which cathode sputtering is to be conducted should be increased in a manner such that the permissible value just mentioned is not exceeded.

Note that the workpieces are heated up during cleaning. So the workpiece temperature and its rate of change must be kept in specified limits, otherwise the workpieces are subject to deformation and the characteristics of the nitrated layer worsen.

Known in the art is a method of chemico-thermal treatment of workpieces in a glow discharge comprising the steps of measuring the workpiece temperature and its rate of change, comparing the measured quantities with their predetermined values, producing corresponding error signals, and forming a signal to control the glow discharge voltage (cf. the FRG accepted application No. 2,606,396, cl. HO5B 7/16).

This method is disadvantageous in that it fails to provide an intense cathode sputtering in many cases due to the fact that the rate of heating or the workpiece temperature is adjusted by varying the glow discharge voltage. The prescribed values of these adjustable quantities may be obtained at the voltage value which is lower than that providing for intense cathode sputtering, which thus worsens the quality of treatment. Another disadvantage of the method is that the frequency of arc occurrence is not held at the given level during chemico-thermal treatment, while the only control action consists in suppressing the glow discharge voltage rise due to the occurrence of arc discharge. Finally, the described method fails to simultaneously maintain at the prescribed levels the rate of change of the workpiece temperature and the frequency of arc occurrence or the workpiece temperature and the frequency of arc occurrence. This is due to the fact that only one control action, the glow discharge voltage, is employed, with the result that the duration of chemico-thermal treatment is increased.

There is a device for carrying out the above method comprising a supply voltage source connected to the leads of a discharge chamber that houses the workpieces. The device also comprises temperature and rate-of-change-of-temperature sensors connected via corresponding comparison elements to a control unit, which is coupled to the supply voltage source. The temperature comparison element has its output coupled to a setting input of the rate-of-change-of-temperature comparison element whose output is connected to a first input of the control unit. The latter is a proportional and integral regulator rated for a great integration constant and having its second input connected to a sensor that acknowledges the occurrence of arc discharge.

The known device utilizes the proportional and integral regulator to control both the workpiece temperature and its rate of change. Moreover, its supply voltage source produces a continuously variable voltage. As a result, the process parameters cannot be adjusted properly.

SUMMARY OF THE INVENTION

The object of the invention is to provide a method and a device for controlling of chemico-thermal treatment of workpieces in a glow discharge in which the treatment is decreased and the treatment quality is increased.

According to the invention there is provided a method of control of chemico-thermal treatment of workpieces in the glow discharge comprising the steps of measuring the temperature of the workpieces and the rate of change of said temperature, comparing said measured quantities with their predetermined values, producing the corresponding error signals, and obtaining a control signal from said error signals to control the glow discharge voltage. The method comprises, in accordance with the invention, a step of measuring, concurrent with the measuring step above, the frequency of occurrence of arc in the glow discharge, comparing said measured frequency with a predetermined value, producing the corresponding error signal, obtaining another control signal from said error signal, and using said another control signal to control the frequency of arc occurrence.

Advantageously, the method of the invention should include steps of using, since the beginning of the treatment of the workpieces till the end of the cathode sputtering, for the glow discharge a pulsed voltage with adjustable amplitude and average values thereof, using the average value of said pulsed voltage in controlling the temperature and its rate of change, and using the amplitude value of said pulsed voltage in controlling the frequency of arc occurrence, thereby providing for an intense cathode sputtering.

Preferably, the method of invention should include steps of comparing the arc occurrence frequency-dependent signal adapted to control the glow discharge voltage with the temperature-dependent control signal or the rate-of-change-of-temperature-dependent control signal and controlling the glow discharge voltage by using one of said control signals being compared which corresponds to a lesser glow discharge voltage, thereby providing for better quality of simultaneous control of at least two characteristics of treatment.

Advantageously, the method of the invention should include a step of decreasing the given value of the arc occurrence frequency when the workpiece temperature is increased.

According to the invention there is provided a device for carrying out the method of the invention comprising a supply voltage source connected to leads of a discharge chamber which houses the workpieces, a workpiece temperature sensor, a rate-of-change-of-temperature sensor, elements adapted to compare respectively the measured temperature and the rate of change thereof with predetermined values of said quantities, and a regulator unit, the outputs of the sensors being connected via their respective comparison elements to said regulator unit which is connected to said supply voltage source, which device comprises, according to the invention, an arc occurrence frequency sensor, an element adapted to compare the frequency of arc occurrence with its predetermined value, a control unit, and a glow discharge voltage transmitter, said regulator unit including regulators adapted to adjust respectively the workpiece temperature, the rate of change thereof and the frequency of arc occurrence, the arc occurrence frequency sensor being connected to the arc occurrence frequency regulator via its corresponding comparison element, the output of the arc occurrence frequency regulator being coupled to a respective one of the inputs of the control unit which has another two inputs coupled respectively to the outputs of the temperature regulator and the rate-of-change-of-temperature regulator, has yet another input thereof coupled to the output of the temperature comparison element, has the remaining input thereof coupled via the glow discharge voltage transmitter to a respective one of said leads, and has its outputs coupled to the supply voltage source.

Advantageously, the device of the invention should have its control unit comprising two switches, a null detector, a minimal signal extractor, and an end-of-cathode sputtering acknowledgement circuit, the output of the null detector being connected to a first input of a first one of said switches which has its output connected to a first input of a second one of said switches, said second switch having its second input coupled to the output of the end-of-cathode sputtering acknowledgement circuit, and having a first output connected to a first input of the minimal signal extractor, the respective inputs of the first switch, the input of the null detector, a second input of the minimal signal extractor, and the input of the end-of-cathode sputtering acknowledgement circuit being used respectively as the inputs of the control unit, and a second output of the second switch and the output of the minimal signal extractor being used respectively as the outputs of the control unit.

Preferably, the device of the invention should have its end-of-cathode sputtering acknowledgement circuit comprising a comparator, a reference voltage source and a time counter, a first input and the output of the comparator being connected respectively to the reference voltage source and to the input of the time counter, a second input of the comparator and the output of the time counter being used respectively as the input and the output of the end-of-cathode sputtering acknowledgement circuit.

BRIEF DESCRIPTION OF THE DRAWINGS

The invention will now be described in more detail, by way of example, with reference to the accompanying drawings, in which.

DETAILED DESCRIPTION OF THE INVENTION

The method of the invention will be described as follows with reference to the drawings that disclose a device for carrying out the method.

Figure 1:
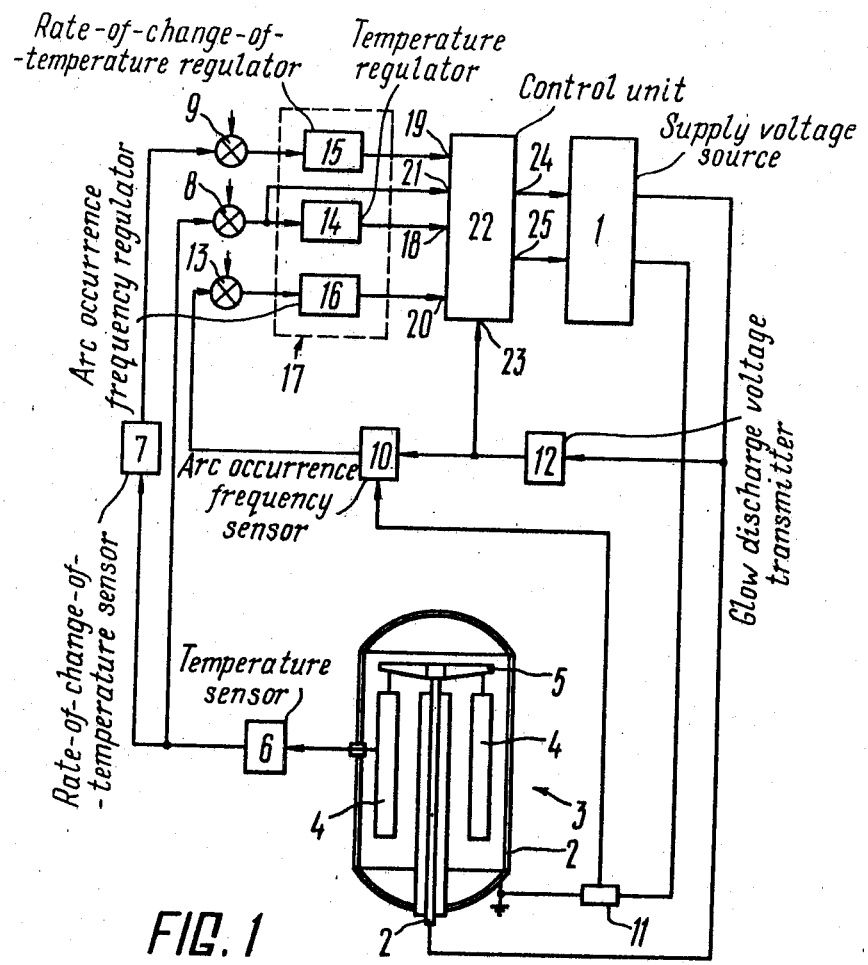
FIG. 1 shows a block diagram of a device for chemico-thermal treatment of workpieces in a glow discharge, according to the invention.

Referring to FIG. 1, the device of the invention comprises a supply voltage source 1 having its outputs connected to leads 2 of a discharge chamber 3 in which workpieces 4 are subject to chemico-thermal treatment. The workpieces 4 in the chamber are connected with suspension members 5. The wall of the chamber 3 serves as one the leads 2. The device of the invention also comprises a temperature sensor 6 having its input coupled to the workpiece 4. A thermocouple with an amplifier can be used as the temperature sensor 6, which has its output connected to the input of a rate-of-change-of-temperature sensor 7 and to a first input of a temperature comparison element 8. The output of the sensor 7 is connected to a first input of a rate-of-change-of-temperature comparison element 9. There is an arc occurrence frequency sensor 10 which has its inputs connected to the outputs of a glow discharge current transmitter 11 and a glow discharge voltage transmitter 12. The output of the sensor 10 is connected to a first input of an arc occurrence frequency comparison element 13. The second inputs of the comparison elements 8,9,13 are used to receive signals that correspond to predetermined values of the workpiece temperature, its rate of change and frequency of arc occurrence. The outputs of the comparison elements 8,9,13 are connected to the inputs of their respective regulators 14,15,16 of a regulator unit 17 which is designed to produce control signals relating to the workpiece temperature, its rate of change and frequency of arc occurrence, depending on the error signals available to the outputs of the comparison elements 8,9,13. The outputs of the regulators 14,15,16 and the output of the comparison element 8 are connected respectively to inputs 18,19,20,21 of a control unit 22 whose input 23 is coupled to the output of the transmitter 12. Outputs 24,25 of the control unit are connected to the inputs of the supply voltage source 1.

The control unit 22 is designed to control the amplitude and average values of the supply voltage.

Figure 2:
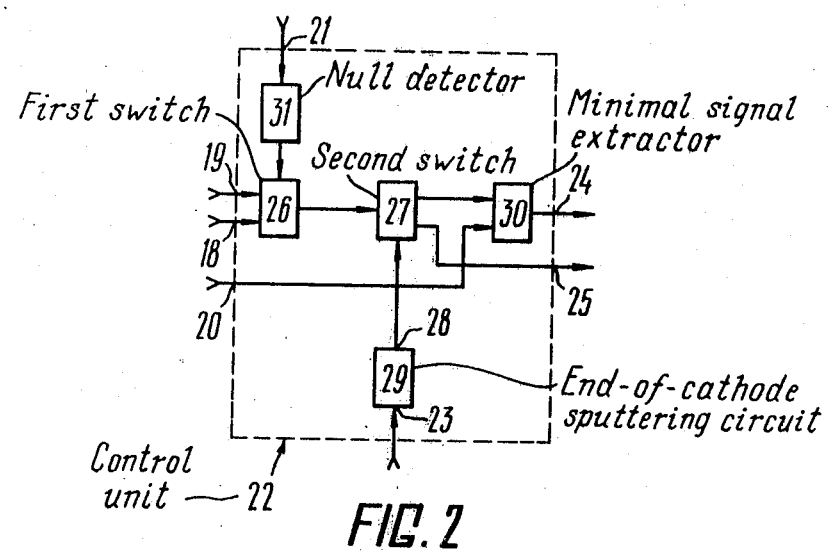
FIG. 2 shows a block diagram of a control unit of the device of the invention.

Referring to FIG. 2, the control unit comprises a switch 26 having its output coupled to a first input of a switch 27. The latter has its second input coupled to an output 28 of an end-of-cathode sputtering acknowledgement circuit 29, and has its first output connected to a first input of a minimal signal extractor 30. A first input of the switch 26 is connected to the output of a null detector 31. Two other inputs of the switch 26, the input of the null detector 31, a second input of the minimal signal extractor 30 and the input of the end-of-cathode sputtering acknowledgement circuit 29 are used respectively as inputs 18,19,21,20,23 of the control unit 22. The output of the minimal signal extractor 30 and a second output of the switch 27 are used respectively as outputs 25 and 24 of the control unit 22. The switch 26 is used to connect the output of one of the regulators, 14 or 15, FIG. 1, to the corresponding input of the switch 27 (FIG. 2) which is used to connect the output of one of the regulators, 14 or 15, FIG. 1, to the corresponding input of the minimal signal extractor 30 or directly to the input 25 of the control unit 22, depending on the presence of a signal at the output 28 of the circuit 29. The extractor 30 operates to compare signals applied to its inputs and select that one of them which has a lesser amplitude.

Figure 3:
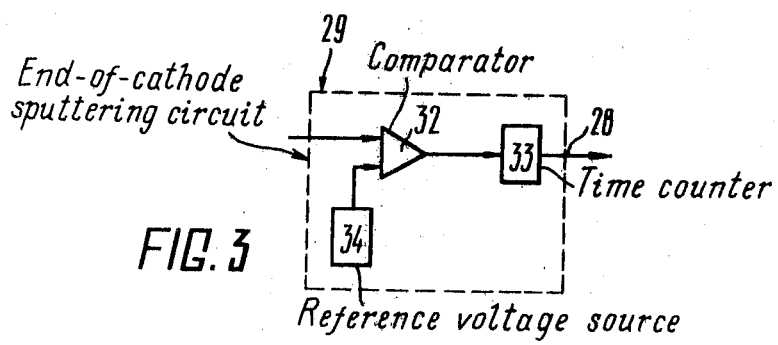
FIG. 3 shows an embodiment of an end-to-cathode sputtering acknowledgement circuit of the device of the invention.

FIG. 3 shows an embodiment of the end-of-cathode sputtering acknowledgement circuit 29 comprising a comparator 32 having its output coupled to the input of a time counter 33. The comparator 32 has a first input connected to a reference voltage source 34 and has its second input used as the input 23 of the control unit 22. The output of the time counter 33 serves as the output 28 of the circuit 29. The comparator 32 operates to compare the supply voltage with the reference voltage from the source 34 corresponding to the given value of the glow discharge voltage. In addition, the comparator 32 produces a signal for actuation of the time counter 33. The latter counts the time during which cathode sputtering is carried out in the presence of a signal at the output of the comparator 32, and produces a signal applied to the input of the switch 27 (FIG. 2) on completion of cathode sputtering.

FIGS. 4 to 7 disclose time diagrams depicting the operation of a control device that exercises control over ion nitrition furnaces.

Figure 4:
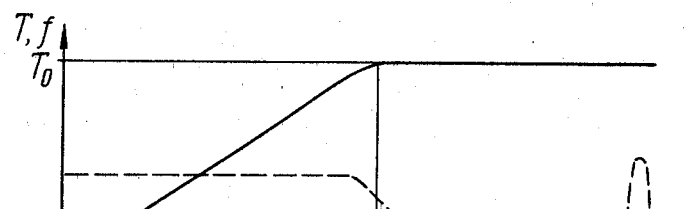
FIG. 4 discloses a time-versus-workpiece temperature and arc occurrence frequency diagram, according to the invention.

FIG. 4 shows how temperature T (solid line) of the workpieces 4 in FIG. 1 and frequency of arc occurrence, f, (dashed line) vary with time. The abscissa axis reads the current values of time t, while the ordinate axis reads the values of T, f and $T_o$. The ordinate $T_o$ stands for the given temperature of the workpiece 4 (FIG. 1).

Figure 5:
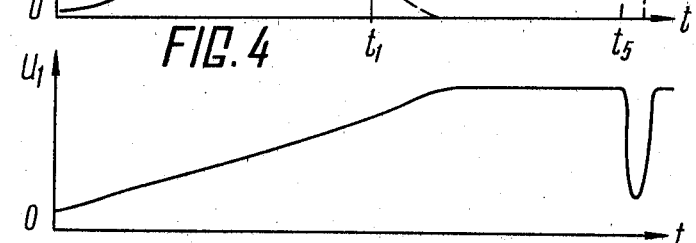
FIG. 5 discloses a time-versus-arc occurrence frequency-dependent control signal, according to the invention.

FIG. 5 shows how control signal $U_1$ at the output of the arc occurrence frequency regulator 16 (FIG. 1) varies with time.

Figure 6:
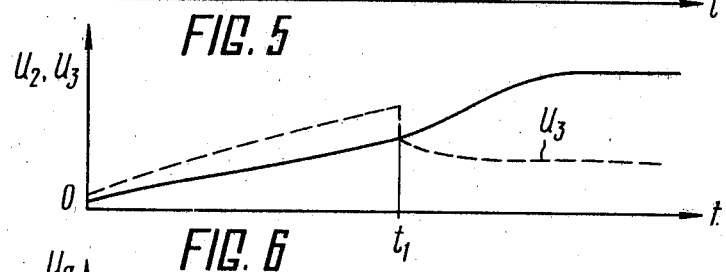
FIG. 6 shows a diagram relating time to temperature-dependent control signal and to rate-of-change-of-temperature-dependent control signal, according to the invention.

FIG. 6 discloses how control signal $U_2$ (solid line) at the output of the rate-of-change-of-temperature regulator 15 and control signal $U_3$ (dashed line) at the output of the temperature regulator 14 vary with time.

Figure 7:
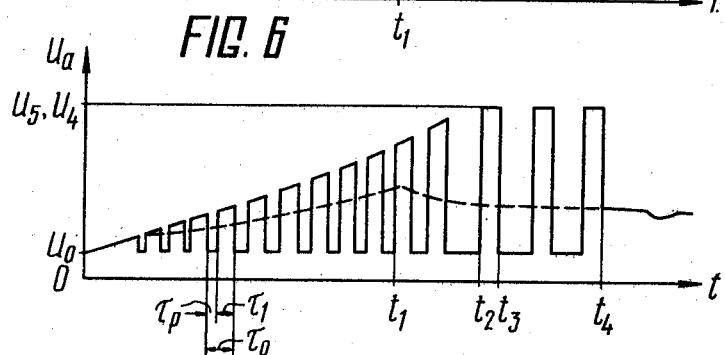
FIG. 7 show a time-versus-supply voltage diagram, according to the invention.

FIG. 7 shows how supply voltage $U_o$ varies with time. In the figure, solid line depicts voltage envelope form, while dashed line depicts the voltage averaged for the period. The ordinate $U_4$ stands for the supply voltage at which an intense cathode sputtering takes place.

The ordinate axis reads values $t_1$, $t_2$, $t_3$, $t_4$, $t_5$ corresponding to the following points in time:

$t_1$ is the point in time when the heating temperature reaches the given value;

$t_2$ is the point in time when the amplitude value of the supply voltage reaches $U_4$;

$t_3$ is the point in time corresponding to the beginning of a space interval between two successive pulses;

$t_4$ is the point in time corresponding to the end of cathode sputtering; and $t_5$ is the point in time corresponding to the beginning of the next occurrence of arc discharge.

In the figure, the letters $\tau_p$, $\tau_1$ and $\tau_o$ stand for the space interval, pulse length, and pulse cycle period, respectively.

The method of the invention is carried out by the device of FIGS. 1,2,3 in the following manner.

At the initial point in time t=0 (FIGS. 4–7), a supply voltage from the source 1 is applied to the leads 2 (FIG. 1) of the discharge chamber 3 which has its value equal to the initial value of $U_o$ (FIG. 7) corresponding to the initial values of the control signals at the inputs of the source 1. There usually result frequent transformations of glow discharge into arc discharge at the beginning of the treatment. Quenching the arc discharge is as follows. The supply voltage is allowed to quickly drop to zero for a short time interval and is then applied anew after the time sufficient for the discharge gap to attain a deionization condition. To this end, the control signal at the corresponding input of the source 1 coupled to the output 24 of the control unit 22 is reduced to zero and is then increased after a certain delay time. The occurrence of arc discharge results in an increase of the discharge current and in a decrease of the discharge voltage. As a result, the signals produced by the current transmitter 11 (FIG. 1) and the voltage transmitter 12 indicate the occurrence of arc discharge. The output of the arc occurrence frequency sensor 10 produces a signal which is proportional to the rate at which arc discharges occur (the frequency of arc occurrence). That signal is applied to a respective input of the arc occurrence frequency comparison element 13 in which it is compared with the signal proportional to the given frequency of arc occurrence. As a result, the output of the element 13 produces a signal proportional to the difference between the given and measured values of the frequency of arc occurrence.

The signal above is applied to the input of the arc occurrence frequency regulator 16 whose output produces, in accordance with the selected law of regulation, signal $U_1$ (FIG. 5) which is employed to control the source 1 (FIG. 1) so as to vary the amplitude value, $U_a$, (FIG. 7) of the supply voltage pulses. A proportional and integral regulator can be used as the regulator 16 (FIG. 1). The signal produced by the regulator 16 is applied to the input 20 of the control unit 22, said input being used as one of the inputs of the minimal signal extractor 30 (FIG. 2). The other input of the extractor 30 receives a signal from the switch 27 that performs, in addition to its basic application, a function of a reference signal source. That signal has a constant value considerably exceeding the value of the signal at the input 20 of the control unit 22. The minimal signal extractor 30 operates to compare the signals at its inputs, with the result that its output works out a smaller signal among those being compared. In the case under consideration, the smaller signal is obtained from the output of the arc occurrence frequency regulator 16. This signal is applied to the input 24 of the supply voltage source 1 and tends to vary the value of $U_2$ (voltage amplitude, FIG. 7) so that the frequency of arc occurrence is held at a given level. Note that $U_a$ is increased in our case.

During the treatment, the workpieces 4 (FIG. 1) are heated up. This results in the appearance at the outputs of the temperature sensor 6 and the rate-of-change-of-temperature sensor 7 of signals that are proportional to the actual values of the workpiece temperature and its rate of change. The comparison elements 8,9 operate to compare these signals with the signals proportional to the given values of the quantities above. Thereafter, the outputs of the comparison elements 8,9 produce error signals relating to the workpiece temperature and its rate of change.

In accordance with these error signals and the selected laws of regulation, the regulators 14,15 produce signals $U_2$ and $U_3$ (FIG. 6) which are used to control the average value of the supply voltage. Proportional and integral regulators can be used as the regulators 14,15. The produced control signals are applied to the inputs 18, 19 (FIG. 1) of the control unit 22 used as the respective inputs of the switch 26 (FIG. 2). The latter operates so that prior to point in time $t_1$ only the rate-of-change-of-temperature-dependent control signal $U_2$ is allowed to be applied to the corresponding input of the switch 27. This signal passes from the output of the regulator 15 via the switch 27 to the input 25 of the supply voltage 1. As a result, the average value $U_5$ of the supply voltage is changed. This reslts in a change of the average value of the discharge voltage, and the rate of heating is thus held at a given level. One can vary the average value $U_5$ by changing, for example, the space interval between pulses, $\tau_p$, with the pulse length, $\tau_1$, and the pulse cycle period, $\tau_o$, kept constant.

At the point in time $t_1$ (FIG. 4) workpiece temperature T reaches a predetermined value of $T_o$. This results in the appearance at the output of the null detector 31 (FIG. 2) of a signal that switches over the switch 26 in a manner such that the output of the latter produces control signal $U_3$ produced by the temperature regulator 14.

It is desirable that the transfer from control signal $U_2$ to control signal $U_3$ be carried out in a smooth fashion. This means that the initial value of $U_3$ is equal to the value of $U_2$ available at the moment of transfer. There results, therefore, a condition at the point in time $t_1$ in which control signal $U_3$ (FIG. 6) from the temperature regulator 14 is applied to the input 25 of the supply voltage source 1. This causes a variation of the average value of the discharge voltage such that the workpiece temperature is held at the given level $T_o$.

At the point in time $t_2$ (FIG. 7) the amplitude value of the supply voltage, $U_a$, reaches $U_4$, which provides for an intense cathode sputtering. The signal at the input 23 of the end-of-cathode sputtering acknowledgement circuit 29, i.e. at one input of the comparator 32 (FIG. 3) becomes equal to the signal delivered to the other input of the comparator and the latter thus produces a signal that drives the time counter 33. At the point in time $t_3$ (FIG. 7), the signal at the output of the comparator 32 (FIG. 3) ceases, and the counter 33 stops counting. Thus the counter 33 counts the time during which the discharge voltage is held at the level $U_4$ (FIG. 7).

At the point in time $t_4$ the time counted by the counter 33 (FIG. 3) reaches a predetermined value, and the output 28 of the circuit 29 produces a signal that switches over the switch 27 (FIG. 2). This causes interchange of the signals at the outputs of the switch 27. Thus, the input 25 (FIG. 1) of the supply voltage source 1 receives a constant signal at which the discharge voltage has practically continuous shape while the first input of the minimal signal extractor 30 receives a signal produced by the temperature regulator 14. The signal produced by the arc occurrence frequency regulator 16 is always received by the second input of the extractor 30 whose output produces a smaller signal (in amplitude) among the two input signals. When no arc discharge occurs, the smaller signal is a temperature-dependent control signal $U_3$. The workpiece temperature is then maintained at the given level $T_o$ (FIG. 4) by varying supply voltage (FIG. 7) of a continuous waveform.

If arc discharge occurs again at the point in time $t_5$ (FIGS. 4,5,7), then the output signal $U_1$ (FIG. 5) of the arc occurrence frequency regulator 16 (FIG. 1) decreases. When that signal reaches a smaller value than the signal $U_3$ (FIG. 6) produced by the temperature regulator 14, the supply voltage decreases and the frequency of arc occurrence thus decreases too.

It is too good practice to reduce the frequency of arc occurrence during heating since the adverse effect of arc discharge is enhanced as the temperature increases. It is necessary in this case to connect the setting input of the arc occurrence frequency comparison element 13 to the input of the temperature sensor 6 (this connection is not shown in FIGS. 1,2,3).

The method and device of the invention make it possible to exercise control over the treatment, prior to termination of cathode sputtering, by using two control parameters simultaneously, i.e. the frequency of arc occurrence and the workpiece temperature or the frequency of arc occurrence and the rate of change of the workpiece temperature in which case the amplitude and average values of the supply voltage are subject to control action. This allows for the use of an intense cathode sputtering at higher voltage, with the result that the treatment time is decreased and the workpiece quality is increased.

The device of the invention has an individual regulator for each control parameter, which provides for better control action and higher quality of workpiece treatment.

What is claimed is:

1. A method of control of chemico-thermal treatment of workpieces in a glow discharge comprising the steps as follows:

measuring the heating temperature of said workpieces;
measuring the rate of change of said temperature;
measuring the frequency of arc occurrence;
comparing said measured quantities with their predetermined values and producing error signals relating to the temperature, its rate of change, and the frequency of arc occurrence;
obtaining at least one control signal adapted to control the glow discharge voltage from said error signals relating to the temperature and its rate of change;
obtaining a control signal adapted to control the glow discharge voltage from said error signal relating to the frequency of arc occurrence; and
regulating the frequency of arc occurrence by means of said arc occurrence frequency-dependent control signal that acts on the glow discharge voltage.

2. A method as claimed in claim 1, comparing the steps as follows:

heating workpieces in a glow discharge having a glow discharge voltage;

subjecting said workpieces to a cathode sputtering concurrent with said heating;
using said glow discharge voltage having a pulsed shape within a time interval lasting since the beginning of said chemico-thermal treatment till the end of said cathode sputtering;
using said glow discharge voltage having an average value and an amplitude value;
regulating the workpiece temperature and its rate of change by changing said average value of said pulsed glow discharge voltage; and
regulating the frequency of arc occurrence by varying said amplitude value of said pulsed glow discharge voltage.

3. A method as claimed in claim 1 comprising the steps as follows:
obtaining an arc occurrence frequency-dependent control signal used to control said glow discharge voltage;
obtaining a temperature-dependent control signal used to control said glow discharge voltage;
comparing said control signals;
extracting from said control signals a smaller one which corresponds to a smaller value of said glow discharge voltage; and
controlling said glow discharge voltage by means of said smaller control signal.

4. A method as claimed in claim 1 comprising the steps as follows:
obtaining an arc occurrence frequency-depending control signal used to control said glow discharge voltage;
obtaining a rate-of-change-of-temperature-dependent control signal used to control said glow discharge voltage;
comparing said control signals;
extracting from said control signals a smaller one which corresponds to a smaller glow discharge voltage; and
controlling said glow discharge voltage by means of said smaller control signal.

5. A method as claimed in claim 1, comprising the steps as follows:
measuring the workpiece temperature;
measuring the frequency of arc occurrence;
comparing the measured frequency of arc occurrence with its predetermined value; and
using a reduced value of said predetermined frequency of arc occurrence when the measured workpiece temperature is increased.

6. A method as claimed in claim 2, comprising the steps as follows:
obtaining an arc occurrence frequency-dependent control signal used to control said glow discharge voltage;
obtaining a temperature-dependent control signal used to control said glow discharge voltage;
comparing said control signals;
extracting from said control signals a smaller one which corresponds to a smaller glow discharge voltage; and
controlling said glow discharge voltage using said smaller control signal.

7. A method as claimed in claim 2, comprising the steps as follows:
obtaining an arc occurrence frequency-dependent control signal used to control said glow discharge voltage;
obtaining a rate-of-change-of-temperature-dependent control signal used to control said glow discharge voltage;
comparing said control signals;
extracting from said control signals a smaller one which corresponds to a smaller glow discharge voltage; and
controlling said glow discharge voltage by means of said smaller control signal.

8. A device for carrying out the method of the invention, comprising:
a supply voltage source having two inputs and an output;
a sensor designed to measure the workpiece temperature, having an input and an output;
a sensor designed to measure the frequency of arc occurrence, having an input and an output;
a sensor designed to measure the rate of change of the workpiece temperature;
a comparison element adapted to compare the measured workpiece temperature with its predetermined value, having an input and an output;
a comparison element adapted to compare the measured rate of change of the workpiece temperature with its predetermined value;
a comparison element adapted to compare the measured frequency of arc occurrence with its predetermined value;
said temperature, rate-of-change-of-temperature and arc occurrence frequency comparison elements having their inputs connected respectively to said outputs of said temperature, rate-of-change-of-temperature and arc occurrence frequency sensors so that said outputs of said comparison elements produce the corresponding error signals in the case when said measured quantities do not correspond to their predetermined values;
other inputs of said comparison elements, intended to receive signals having said predetermined values;
a regulator having an input and an output and adapted to produce a temperature-dependent control signal used to control glow discharge voltage;
a regulator having an input and an output and adapted to produce a rate-of-change-of-temperature-dependent control signal used to control said glow discharge voltage;
a regulator having an input and an output and adapted to produce an arc occurrence frequency-dependent control signal used to control said glow discharge voltage;
a control unit adapted to control the amplitude and average values of the voltage produced by said supply voltage source;
said control unit having first, second, third, fourth and fifth inputs and first and second outputs;
said temperature, rate-of-change-of-temperature and arc occurrence frequency regulators having said inputs being connected respectively to said outputs of their corresponding comparison elements;
said control unit having its first, third and fourth input connected respectively to said outputs of their corresponding regulators;
said second input of said control unit connected to said output of said temperature comparison element;
said outputs of said control unit connected to the corresponding inputs of said supply voltage source; and
a glow discharge voltage transmitter adapted to measure said glow discharge voltage, having an input and an output;

said input and said output of said glow discharge voltage transmitter being connected respectively to said output of said supply voltage source and to said fifth input of said control unit; and said arc occurrence frequency sensor being coupled to said glow discharge voltage transmitter.

9. A device as claimed in claim 8, comprising said control unit which includes:

a first switch having three inputs and an output;

a second switch having two inputs and two outputs;

a null indicator having an input and an output;

an end-of-cathode sputtering acknowledgement circuit having an input and an output; and a minimal signal extractor having two inputs and an output and adapted to compare the signals at their inputs and select one of them having a smaller amplitude;

said output of said null detector being coupled to said first input of first switch;

said first input and said first output of said second switch being connected respectively to said output of said first switch and to said first input of said minimal signal extractor;

said second input of said second switch being connected to said output of said end-of-cathode sputtering acknowledgement circuit;

the corresponding inputs of said first switch, said input of said null detector, said second input of said minimal signal extractor, and said input of said end-of-cathode sputtering acknowledgement circuit being used respectively as said first, third, second, fourth and fifth inputs of said control unit; and said second output of said second switch and said output of said minimal signal extractor being used respectively as said outputs of said control unit.

10. A device as claimed in claim 9, comprising said end-of-cathode sputtering acknowledgement circuit which includes:

a comparator having two inputs and an output;

a reference voltage source having an output; and a time counter having an input and an output and adapted to count and sum up the time intervals during which said cathode sputtering takes place;

said first input of said comparator being used as said fifth input of said control unit;

said second input of said comparator being connected to said output of said reference voltage source; and said output of said comparator being connected to said input of said time counter whose output is used as said output of said end-of-cathode sputtering acknowledgement circuit.

* * * * *